United States Patent [19]

Yamashita et al.

[11] Patent Number: 5,073,229
[45] Date of Patent: Dec. 17, 1991

[54] SEMICONDUCTOR CRYSTAL PULLING METHOD

[75] Inventors: Youji Yamashita, Yokohama; Masakatu Kojima, Yokosuka, both of Japan

[73] Assignee: Kabushiki Kaisha Toshiba, Kawasaki, Japan

[21] Appl. No.: 545,098

[22] Filed: Jun. 29, 1990

Related U.S. Application Data

[63] Continuation of Ser. No. 314,857, Feb. 24, 1989, abandoned.

[30] Foreign Application Priority Data

Feb. 25, 1988 [JP] Japan .................................. 63-42583

[51] Int. Cl.⁵ ............................................. C30B 15/12
[52] U.S. Cl. ................... 156/605; 156/617.1; 156/620.3; 156/620.4; 422/249
[58] Field of Search ............................. 422/248, 249; 156/617.1, 618.1, 619.1, 605, 620.2, 620.3, 620.4, DIG. 70, DIG. 98

[56] References Cited

U.S. PATENT DOCUMENTS

| | | | |
|---|---|---|---|
| 2,892,739 | 6/1959 | Rusler | 156/605 |
| 4,352,784 | 10/1982 | Lin | 156/DIG. 83 |
| 4,894,206 | 1/1990 | Yamashita et al. | 156/607 |

FOREIGN PATENT DOCUMENTS

2180469  4/1986  United Kingdom .

OTHER PUBLICATIONS

Brice, *Crystal Growth Process*, Halsted Press, 1986, p. 149.

Ghandi, *VLSI Fabrication Principles*, John Wiley & Sons, 1983, p. 91.

*Primary Examiner*—Michael Lewis
*Assistant Examiner*—Stephen G. Kalinchak
*Attorney, Agent, or Firm*—Finnegan, Henderson, Farabow, Garrett, and Dunner

[57] ABSTRACT

A crystal pulling method includes the steps of disposing a separation wall concentrically with an in a semiconductor crystal pulling crucible to divide the crucible into an inner chamber and an outer chamber, putting first doped material melt into the inner chamber and second material melt into the outer chamber, and pulling crystal from the first material melt in the inner chamber while the second material melt in the outer chamber is being supplied to the inner chamber via a coupling member which connects the inner and outer chamber with each other but suppresses the outflow of impurity from the inner chamber to the outer chamber. Assume that k is the segregation coefficient of doping impurity in the first material melt, r is half the inner diameter of the inner chamber, and R is half the inner diameter of the outer chamber. The second material melt in the outer chamber is undoped melt, and the condition of $(r/R) > \sqrt{k}$ is set to increase the doping impurity concentration in the longitudinal direction of the crystal, or the condition of $(r/R) < \sqrt{k}$ is set to lower the doping impurity concentration in the longitudinal direction of the crystal so as to compensate for or cancel the influence by conductive impurity which has flowed out of the crucible and mixed into the melt, thus controlling the resistivity of the pulling crystal in the longitudinal direction thereof.

15 Claims, 9 Drawing Sheets

SEMICONDUCTOR CRYSTAL PULLING METHOD

This application is a continuation, of application Ser. No. 07/314,857, filed Feb. 24, 1989, now abandoned

BACKGROUND OF THE INVENTION

1. Field of the Invention

This invention relates to a crystal pulling method for growing semiconductor crystal using a crucible called an integral type double crucible, and more particularly to a uniform resistivity control method used in a case where two kinds of dopants or two different dopant concentration melts are used.

2. Description of the Related Art

In a case where rod-like semiconductor single crystal is grown from melt in the crucible by Czochralski technique (CZ technique), impurity concentration distribution C in the longitudinal direction of the grown single crystal can be expressed as follows.

$$C = kC_0(1-G)^{k-1}$$

where k is a segregation coefficient of dopant, Co is the initial impurity concentration of the melt, and G is solidification ratio. Therefore, the impurity concentration distribution in the longitudinal direction significantly varies when k is small, thus lowering the yield of the single crystal having a desired preset resistivity range.

In order to solve this problem, a floating type double crucible method in which the surface level of melt in the inner crucible is kept at a constant level has been proposed and used for growing single crystals of germanium and silicon (See J. Applied Physics vol. 9 No. 8, '58, Japanese Patent Publication 60-18634).

Figure 9:
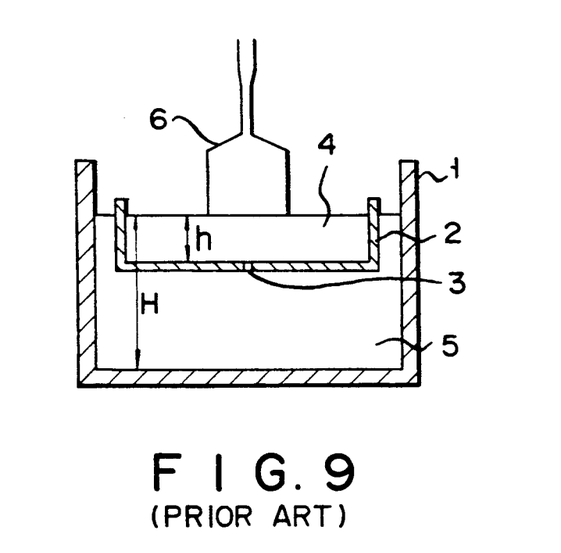
FIG. 9 is a sectional view of the main portion of a floating type double crucible.

Now, the double-crucible method is explained with reference to FIG. 9. As shown in FIG. 9, inner crucible 2 is arranged as a floating crucible inside outer crucible 1, and small hole 3 is formed in the bottom portion of inner crucible 2. When crystal 6 is pulled from melt 4 in inner crucible 2, the balance between the buoyancy and gravitational force of the inner crucible is utilized, for example, or the outer crucible is lifted relative to the fixed inner crucible, so that melt 5 can be supplied from the outer crucible to the inner crucible, thus keeping the height h of the surface level of the melt in the inner crucible at a constant level.

Assume that the impurity concentration of melt 5 in the outer crucible is Co, and the impurity concentration of melt 4 in the inner crucible is Co/k (k is a segregation coefficient). Then, the concentration of impurity taken into pulling crystal 6 becomes Co in the pulling process in which surface level h of the melt is kept constant. Thus, the same amounts of melt (pure silicon or germanium) and impurity as those used for growing the crystal are always supplied from melt 5 in the outer crucible to melt 4 in the inner crucible. As a result, the impurity concentration of melt 4 in the inner crucible is kept at Co/k and, therefore, the impurity concentration of pulling crystal 6 can also be kept at constant value Co.

However, in the pulling process, the melt is consumed. After the bottom portion of inner crucible 2 has reached the inner bottom portion of outer crucible 1, the melt surface level in the inner crucible cannot be kept constant, and the impurity concentration of crystal 6 will vary (increase) as the solidification ratio increases. That is, the impurity concentration can be kept constant only within the following range of the solidification ratio X:

$$0 \leq X \leq 1-(h/H) \qquad (1)$$

where H is the initial surface level of the melt in the outer crucible, and h is the surface level of the melt in the inner crucible to be kept constant during the pulling process. Therefore, in a case where the floating type double-crucible method is effected by using impurity acting as donor or acceptor to grow crystal having constant resistivity in the longitudinal direction, the resistivity can be kept constant only when the solidification ratio is less than 0.6 to 0.7. If the solidification ratio becomes larger, the resistivity will significantly vary.

Figure 10:
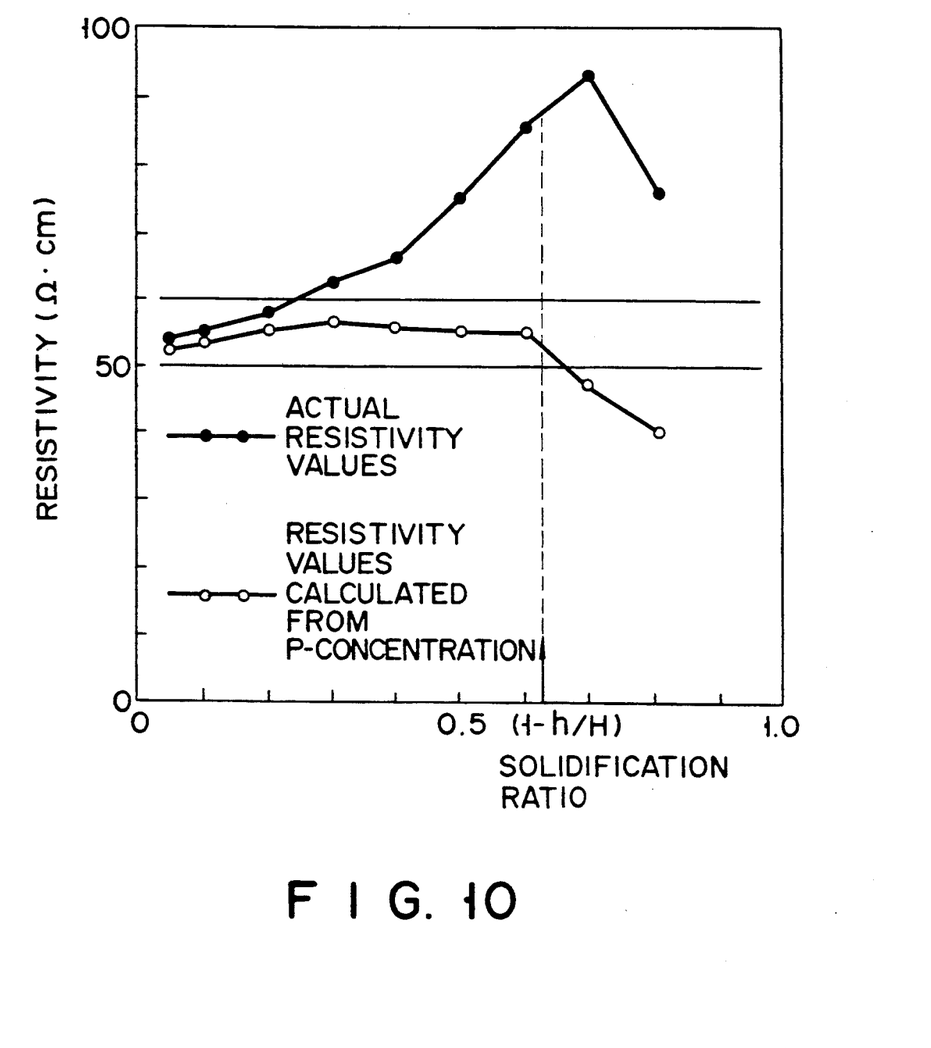
FIGS. 10 and 11 are graphs explaining the problem of the floating type double crucible.

Further, it was found that the constant resistivity of the crystal could not be obtained even in the range of the solidification ratio expressed by equation (1) when the floating type double crucible method was effected to be intended to grow crystal having constant and high resistance in its longitudinal direction. This problem occurs when, for example, the low donor (phosphorus P) concentration is used to grow high resistance N-type silicon single crystal with the resistivity of more than 20 $\Omega$.cm and so the donor concentration is not sufficiently high with respect to the acceptor concentration of boron (B), aluminum (Al) or the like flowing out of the quartz crucible. In this case, as shown in FIG. 10, the actual resistivity value (indicated by mark ●) gradually increases with increase in the solidification ratio and the resistivity value of the crystal cannot be determined only by the concentration (indicated by mark ○) of doped donor impurity (P).

Figure 1:
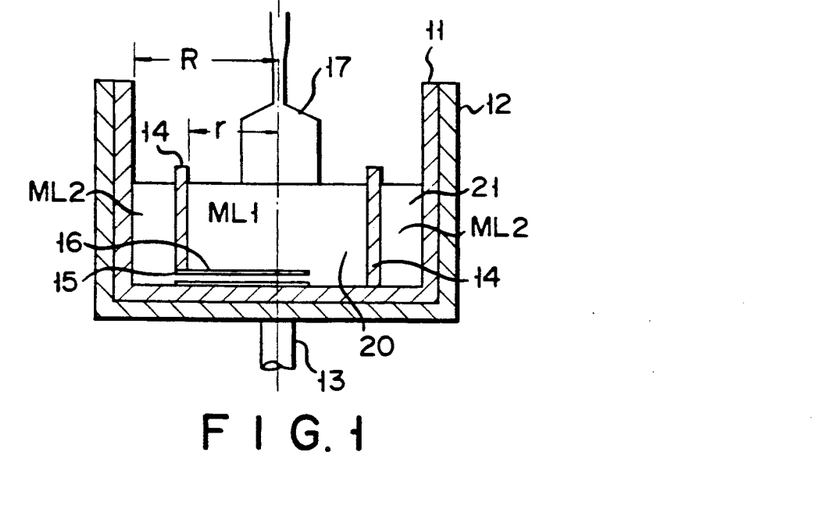
FIG. 1 is a sectional view showing the main portion of a double crucible which can be used in a crystal pulling method according to one embodiment of this invention.

The inventors of this invention have proposed a pulling apparatus having an integral type double crucible (Japanese Patent Application No. 61-221896, or U.S. patent application Ser. No. 091,947 filed on Sept. 1, 1987). The pulling apparatus is shown in FIG. 1. In FIG. 1, 11 denotes an outer crucible, and 14 denotes a cylindrical separation wall integrally and coaxially formed with outer crucible 11. The inner space of outer crucible 11 is divided into inner chamber 20 and outer chamber 21 by separation wall 14. Inner chamber 20 and outer chamber 21 are connected with each other by means of small hole 15 and narrow pipe-like coupling tube 16 formed with small hole 15. With this construction, melt ML2 in outer chamber 21 is supplied to inner chamber 20 while single crystal 17 is being pulled from melt ML1 in the inner chamber.

The impurity of melt ML1 in the inner chamber is inhibited from flowing into the outer chamber by the preset length L of coupling tube 16 not only during the pulling process but also when melt is not transferred from outer chamber 21 to inner chamber 20. Length L is determined to be larger than four times inner diameter a of tube 16. In this respect, the integral type double crucible is different from the floating type double crucible which has only hole 15.

One of the proposed crystal pulling methods using the integral type double crucible is to solve the problem that the impurity concentration in the longitudinal direction of crystal formed by the floating type double crucible method is limited by the solidification ratio used in equation (1). In this case, doped material melt ML1 (impurity concentration Ci) is received in inner chamber 20 of the integral type double crucible and undoped material melt ML2 is received in outer chamber 21. Further, ratio r/R of radius r of inner chamber 20 and radius R of outer chamber 21 is set to be equal to square root $\sqrt{k}$ of segregation coefficient k of the doping impurity and crystal 17 of impurity concentration kCi is pulled by $\pi R^2 \Delta H$ ($\Delta H$ is decrease in the surface level of melt ML1) from melt ML1 in the inner chamber. Then, the amount of impurity $\pi R^2 \Delta H \times kCi$ included in a portion of crystal 17, which has been grown during the surface level decreases by $\Delta H$, becomes equal to the amount of impurity $\pi r^2 \Delta H \times Ci$ included within a portion of melt ML1 having width $\Delta H$ so that the impurity concentration of melt ML1 in the inner chamber is kept at constant value Ci during the pulling process. As a result, the impurity concentration in the longitudinal direction of crystal 17 can be kept at constant value kCi.

Figure 11:
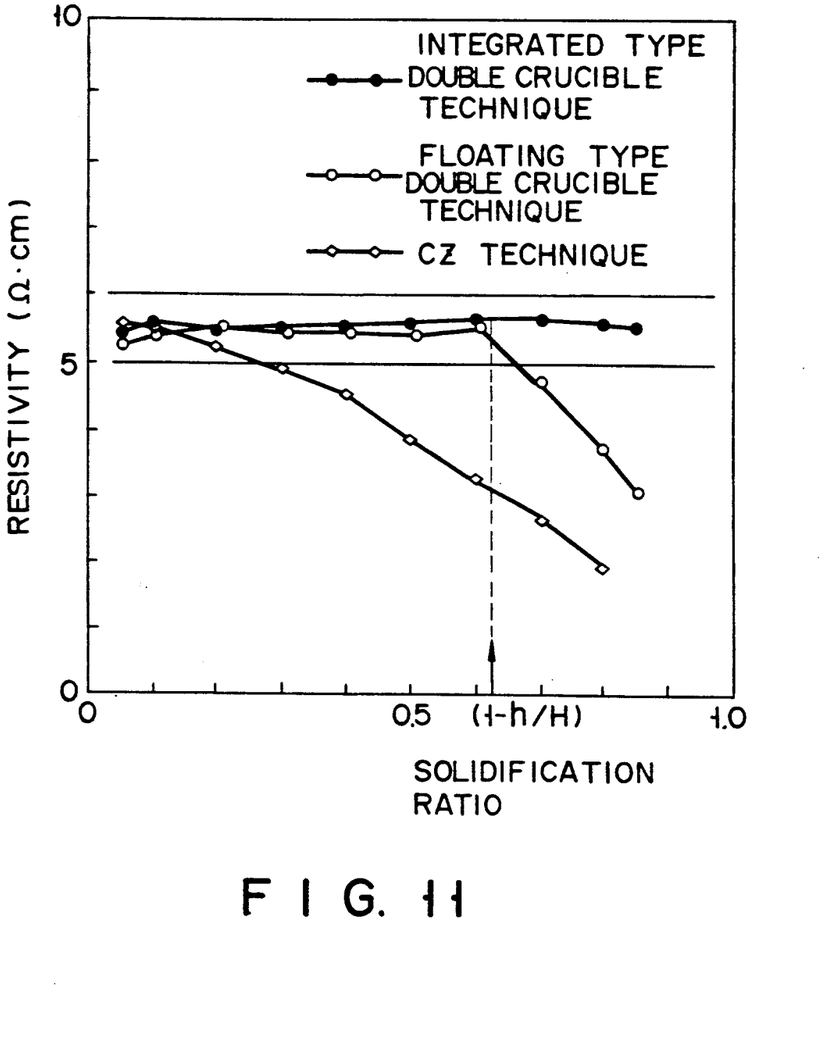

FIG. 11 shows the relation between the resistivity (ordinate) and the solidification ratio (abscissa) of single crystal formed by the integral type double crucible method effected in a condition of $r/R = \sqrt{k}$ in comparison with those obtained by the CZ technique and the floating type double crucible method. As shown in FIG. 11, in a case where constant-resistivity crystal is formed by the proposed integral type double crucible method (Japanese Patent Application No. 61-221896 or U.S. Ser. No. 091,947), the problem that the solidification ratio is limited by equation (1) in the floating type double crucible method can be solved.

However, even in the integral type double crucible pulling method, electrically conductive impurity (B, Al or the like) flows out of the crucible itself and may cause an inadvertent influence, making it difficult to attain crystal of high and constant resistivity. For example, in a case where two kinds of dopants or two different dopant concentration melts are used, there still remains a problem.

SUMMARY OF THE INVENTION

An object of this invention is to provide a novel crystal pulling method by which substantially 100% of yield with respect to the resistivity of crystal can be attained.

More specifically, an object of this invention is to provide a crystal pulling method capable of controlling the resistivity in the longitudinal direction of crystal (1) when electrically conductive impurity of the opposite or the same conductivity type is unintentionally introduced into the melt, (2) when two kinds of electrically conductive impurity of the opposite conductivity types are intentionally introduced into the melt, or (3) when melt regions with two different impurity concentration levels of the same conductivity type are intentionally formed.

The crystal pulling method of this invention for compensating for variation in the characteristic of the pulling crystal due to inadvertent introduction of electrically conductive impurity is effected by using an integral type double crucible. This crucible is divided into inner chamber 20 and outer chamber 21 by concentric or coaxial cylindrical separation wall 14. In this case, first doped material melt ML1 is received in inner chamber 20 and second undoped material melt ML2 is received in outer chamber 21.

Assume that the segregation coefficient of doping impurity is k, the inner diameter of inner chamber 20 is 2r, and the inner diameter of outer chamber 21 is 2R. Then, (r/R) is set to be larger than $\sqrt{k}$ so as to increase the concentration of the doping impurity in the longitudinal direction of the crystal, thus compensating for the influence by impurity of the opposite conductivity types unintentionally introduced into crystal 17. Otherwise, (r/R) is set to be smaller than $\sqrt{k}$ so as to decrease the concentration of the doping impurity in the longitudinal direction of the crystal, thus compensating for the influence by impurity of the same conductivity types unintentionally introduced into crystal 17.

For example, the influence of changing the resistivity in the longitudinal direction of the crystal by P-type or N-type impurity unintentionally introduced into N-type crystal can be compensated for by intentionally changing the concentration of the N-type doping impurity in the longitudinal direction of the crystal. Thus, the resistivity in the longitudinal direction of the pulling crystal can be controlled.

For example, suppose that the resistivity of more than 20 $\Omega$.cm is controlled in the longitudinal direction of phosphorus (P) doped N-type high resistance silicon single crystal pulled from a quartz crucible from which acceptor, such as B or Al, flows out of the quartz crucible, and segregation coefficient k is set at 0.35 and therefore $\sqrt{k}$ is 0.59. In this case, the ratio of (r/R) is set to satisfy the condition of $0.85 \gtrsim (r/R) > 0.59$. Selection of the resistivity in the above range can be made by previously detecting the amount of acceptor flowing out of the crucible.

In general, ratio r/R must be understood as ratio $\sqrt{Si/(So+Si)}$ when the upper surface area of melt in inner chamber 20 is Si and the upper surface area of melt in outer chamber 21 is So. That is, the above range is determined by using $\sqrt{Si/(Si+So)}$ instead of r/R when the crucible and separation wall are not cylindrical. The range must be set to satisfy the condition that $0.85 > \sqrt{Si/(Si+So)} > 0.59$, for example.

In another crystal pulling method of this invention, two kinds of conductive impurities of opposite conductivity types are intentionally introduced. In this method, first doped material melt ML1 is received in inner chamber 20 of the integral type double crucible, and conductive impurity having a conductivity type (P) opposite to the conductivity type (N) of the doped impurity of melt ML1 is introduced into second material melt ML2 in outer chamber 21. The doped impurity concentration of melt ML1, which will become high during the pulling process, is reduced and compensated for by introducing melt ML2 into the inner chamber. The resistivity variation in the longitudinal direction of pulling crystal can thus be controlled.

Assume now that the radius of the outer crucible is R and the radius separation wall 14 is r. Then, area Si of inner chamber 20 is $\pi r^2$, area So of outer chamber 21 is $\pi(R^2 - r^2)$, and total area (Si+So) of crucible 11 is $\pi R^2$.

When the solidification ratio is x, concentration $C_S{}^A(x)$ of impurity A which has been doped into melt ML1 in the inner chamber and has been taken into pulling crystal 17 can be expressed as follows.

$$C_S{}^A(x) = k_A C_m{}^A(0)(1-x)k_{eff-1}{}^A \qquad (2)$$

where $$k_{eff}{}^A = k_A \times (\pi R^2 / \pi r^2) \qquad (3)$$

and $k_A$ is the segregation coefficient of impurity A and $C_m{}^A(0)$ is the concentration of impurity A in melt of the inner chamber at the initial pulling stage.

Further, when the solidification ratio is x, concentration $C_S{}^B(x)$ of impurity B which has been doped into melt ML2 in the outer chamber and taken into pulling crystal 17 can be expressed as follows.

$$C_S{}^B(x) = \frac{C_m{}^B(0)(k_{eff}^B - k_B)}{1 - k_{eff}^B} \times \{(1 - x)^{k_{eff}^B - 1} - 1\} \quad (4)$$

where $$k_{eff}^B = k_B \times (\pi R^2/\pi r^2) \quad (5)$$

and $k_B$ is the segregation coefficient of impurity B and $C_m{}^B(0)$ is the concentration of impurity B in melt of the outer chamber at the initial pulling stage.

The effective concentration of impurity A in the crystal with solidification ratio x can be kept at substantially the same value as that of the crystal obtained at the initial pulling stage by such a manner that one of impurity A and impurity B compensates for the other thereof. For this purpose, concentration $C_m{}^B(0)$ of impurity B which determines $C_S{}^B(x)$ in equation (4) is so adjusted to substantially satisfy the following equation.

$$C_S{}^A(x) - C_S{}^A(0) = C_S{}^B(x) \quad (6)$$

If equation (6) is satisfied, the resistivity becomes equal in portions with solidification ratios of 0 and x ($0 < x < 0.85$). Further, the resistivity in portions with the solidification ratio other than the portion of x in the solidification ratio can be controlled, so that deviation of the resistivity from a desired value can be suppressed within a relatively narrow range.

When impurities A and B of the same conductivity type, the resistivity of the crystal can be kept constant. That is, when the solidification ratio is x, impurity concentration Cs(x) in the pulling crystal can be expressed as follows.

$$Cs(x) = kCi(0)(1 - x)^{k_{eff} - 1} + \frac{Co(0)(k_{eff} - k)}{1 - k_{eff}} \times \{(1 - x)^{k_{eff} - 1} - 1\} \quad (7)$$

where $$k_{eff} = k \times (\pi R^2/\pi r^2) \quad (8)$$

and k is the segregation coefficient of impurity, Ci(0) is the impurity concentration of the melt in the inner chamber at the initial pulling stage, and Co(0) is the impurity concentration of the melt in the outer chamber at the initial pulling stage.

If impurity is doped to adjust impurity concentration Co(0) of the melt in the outer chamber so as to satisfy the following equation, $$kCi(0) = -Co(0)(k_{eff} - k)/(1 - k_{eff}) \quad (9)$$

then the following equation can be obtained by substituting equation (9) into the second term of equation (7).

$$Cs(x) = kCi(0)(1 - x)^{k_{eff} - 1} - kCi(0)\{(1 - x)^{k_{eff} - 1} - 1\} \quad (10)$$
$$= kCi(0)$$

Thus, the impurity concentration in the crystal can be made constant in the longitudinal direction thereof.

In the method of this invention, a coupling mechanism (15, 16) provided between the inner and outer chambers can be used to suppress the outflow of doped impurity included in melt ML1 in the inner chamber of the integral type double crucible to outer chamber 21. In this case, it should be noted that the coupling mechanism is not limited to pipe-like tube 16.

DETAILED DESCRIPTION OF THE PREFERRED EMBODIMENTS

Now, this invention is explained with reference to an embodiment applied to a silicon single crystal pulling method.

FIG. 1 shows a crystal pulling apparatus used in one embodiment of this invention. As shown in FIG. 1, graphite crucible 12 is mounted on vertically movable and rotatable crucible shaft 13, and quartz crucible 11 of 12"φ is disposed in close contact with the inner surface of graphite crucible 12. Quartz cylindrical separation wall 14 with radius r is coaxially disposed in and bonded to crucible 11. Hole 15 is formed in separator wall 14 and quartz pipe 16 which has inner diameter a (=6 mm)

and length L (=150 mm), and pipe 16 with hole 15 is mounted on wall 14. L is determined to satisfy the condition: $2\pi r > L \geq 4a$.

With this double crucible, silicon crystal 17 of 4"φ is pulled from melt ML1 in inner chamber 20 of the crucible which is divided by separation wall 14. Further, ML2 denotes melt in outer chamber 21.

In the following embodiments using the integral type double crucible, the charge amount of silicon material was 14 kg. Further, when the coupling means is constructed only by means of small hole 15, supply of dopant impurity to inner chamber 20 or outer chamber 21 is effected after the grown crystal in the stage of the shouldering becomes 10 mmφ and before the straight body thereof, so that reverse flow of the melt from inner chamber 20 to outer chamber 21 is prevented. When the coupling means between the inner and outer chambers is formed of pipe-like passage 16 which has an effect of suppressing the outflow of impurity from inner chamber melt ML1 to outer chamber melt ML2, supply of dopant impurity is effected after material silicon has melted and the surface levels of the melts in the inner and outer chambers have become equal to each other.

EMBODIMENT 1

Figure 2:
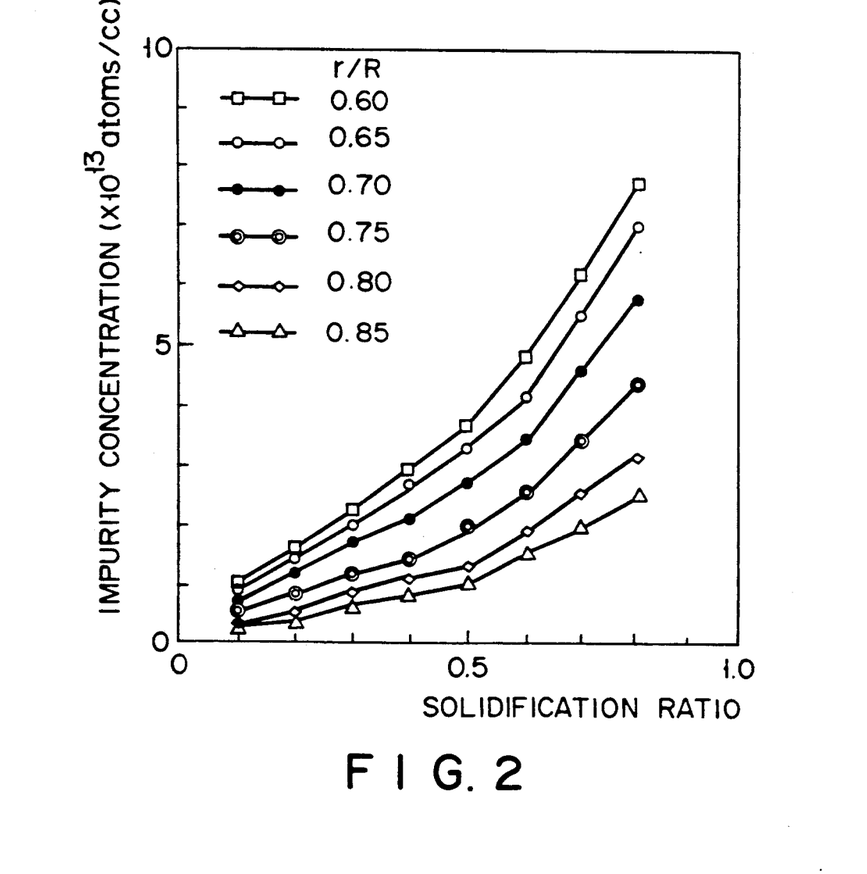
FIG. 2 is a graph showing the relation between the solidification ratio and the impurity concentration of silicon single crystal obtained by the crystal pulling method according to one embodiment of this invention, with r/R used as a parameter.

In embodiment 1, impurity which is flowed out from the quartz crucible is compensated for and high resistance N-type single crystal having a uniform resistivity of 50 Ω.cm and 100 Ω.cm, which is constant in the longitudinal direction thereof, is pulled. In order to check the concentration of impurity of flowing out of the double crucible (11, 14), inner diameter 2r of the separation wall was variously changed, crystals were grown from the undoped melt (in both the inner and outer chambers), and then the conductivity types and the resistances of the grown crystals were detected and the apparent impurity concentration was derived based on these detected values. As the result, the conductivity type of the flow-out impurity from crucible body 11 and separation wall 14 of quartz was detected to be P-type, and the resistivity in the longitudinal direction was detected to decrease from the head portion of 1000 to 2000 Ω.cm to the tail portion of several hundreds Ω.cm. FIG. 2 shows the distribution of the derived impurity concentration.

Figure 3:
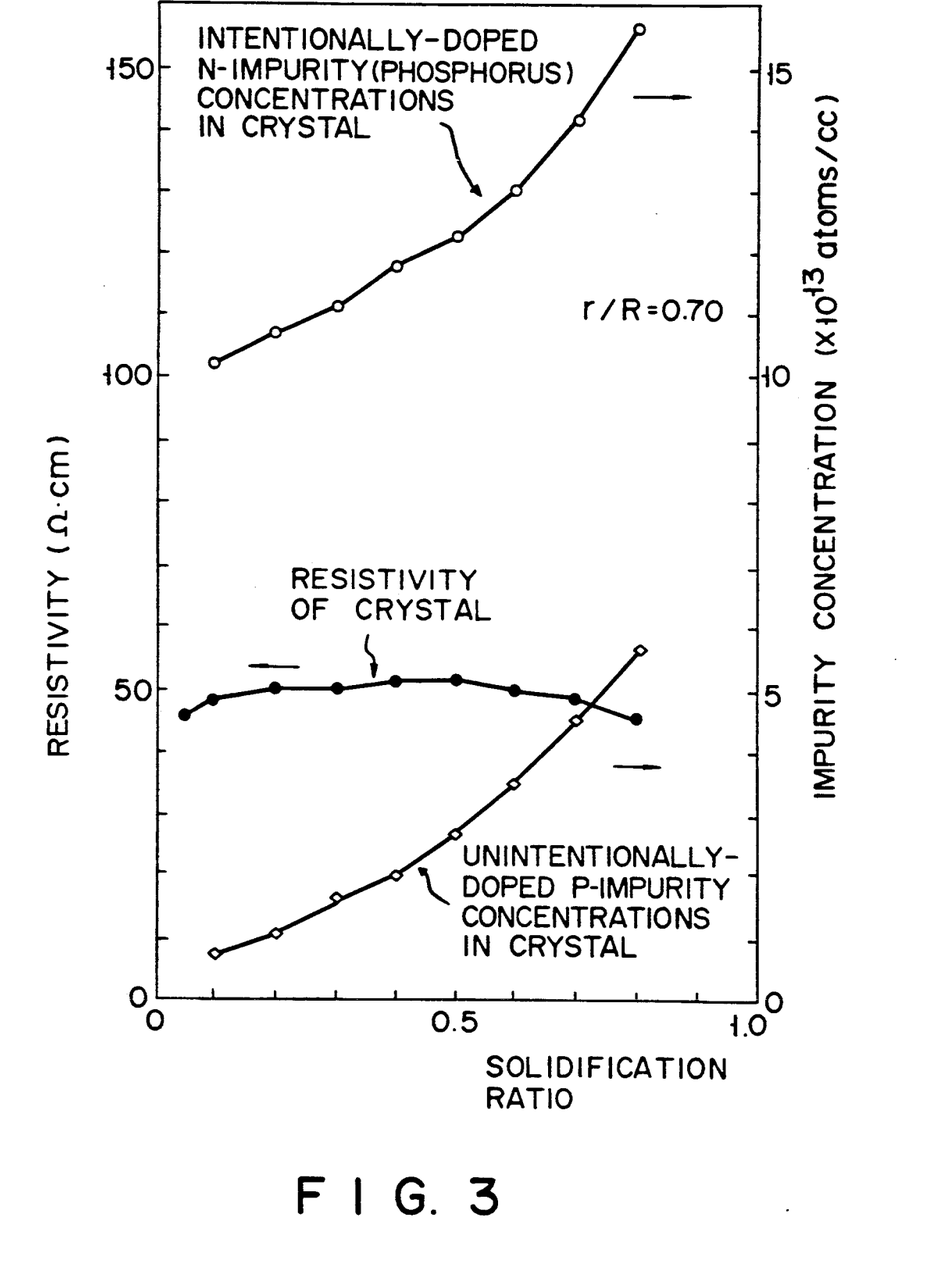
FIG. 3 is a graph showing the relation between the solidification ratio, the resistivity and the impurity concentration of silicon single crystal obtained by the crystal pulling method according to one embodiment of this invention, with r/R set at 0.70.

Ratio r/R was set to 0.70 according to the result of FIG. 2. Phosphorus was doped into melt ML1 in the inner chamber so as to set the resistivity of the crystal head portion to 50 Ω.cm (the concentration of phosphorus is $1 \times 10^{14}$ atoms/cc). Melt ML2 in the outer chamber was kept undoped. Under this condition, single crystal 17 of N-type high resistance was pulled. FIG. 3 shows the distribution of the resistivity and the impurity concentration in the longitudinal direction of single crystal 17.

FIG. 3 indicates that gradually increasing amount of P-type impurity (mark ) flowing out of the quartz crucible (11, 14) with ratio r/R set at 0.70 and unintentionally doped into crystal 17, can be compensated for by gradually increasing concentration (mark o) of N-type impurity (P) intentionally doped into crystal 17 and, consequently, the resistivity (mark •) of crystal 17 can be made substantially constant in the longitudinal direction.

Figure 4:
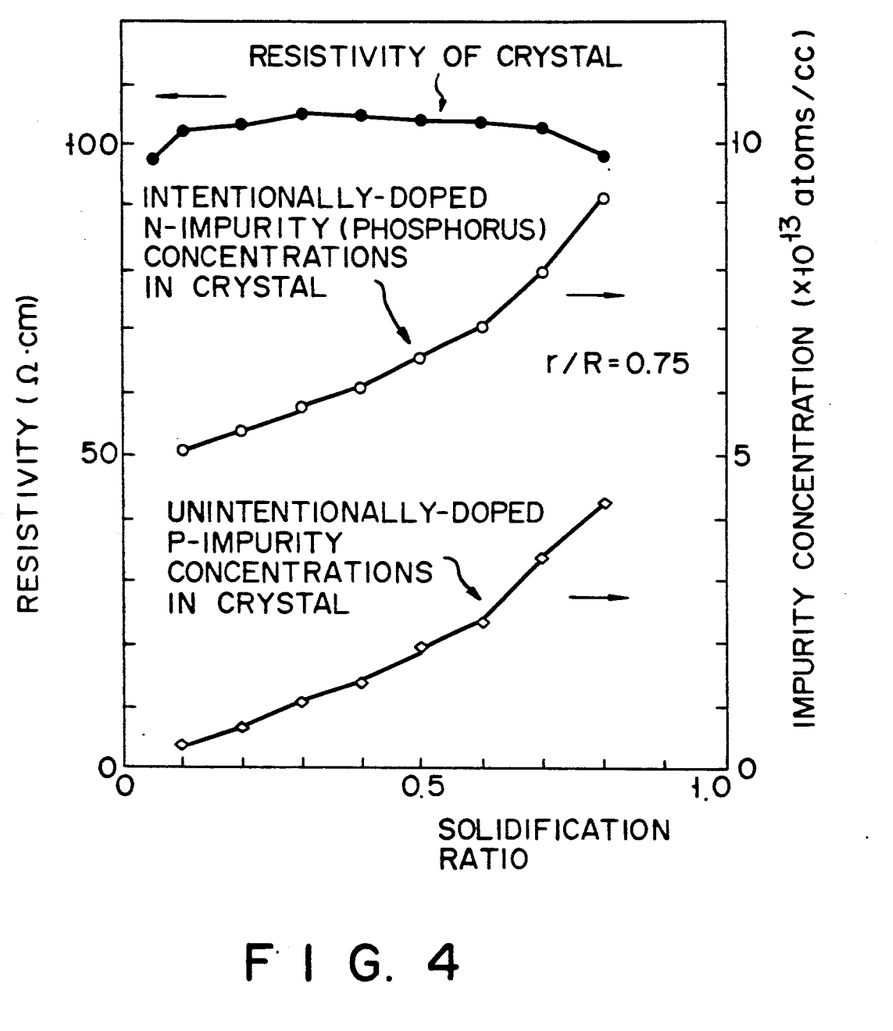
FIG. 4 is a graph showing the relation between the solidification ratio, the resistivity and the impurity concentration of silicon single crystal obtained by the crystal pulling method according to one embodiment of this invention, with r/R set at 0.75.

Further, single crystal of N-type high resistance having the resistivity of 100 Ω.cm (phosphorus concentration is $0.5 \times 10^{14}$ atoms/cc) was pulled with ratio r/R set to 0.75. The result was the same as before and is shown in FIG. 4.

Figure 5:
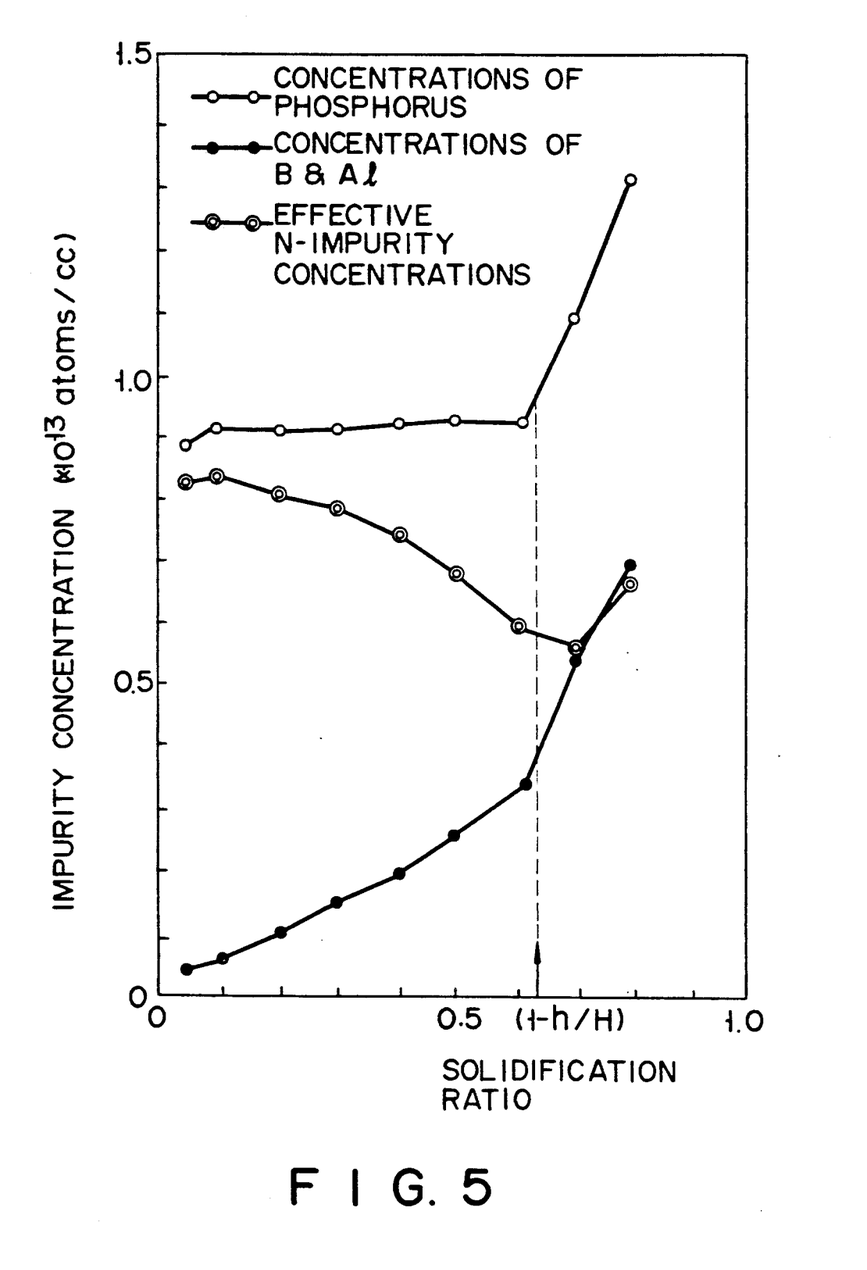
FIG. 5 is a graph showing the relation between the solidification ratio and the impurity concentration of silicon single crystal obtained by a crystal pulling method other than the crystal pulling method of this invention.
Figure 6A:
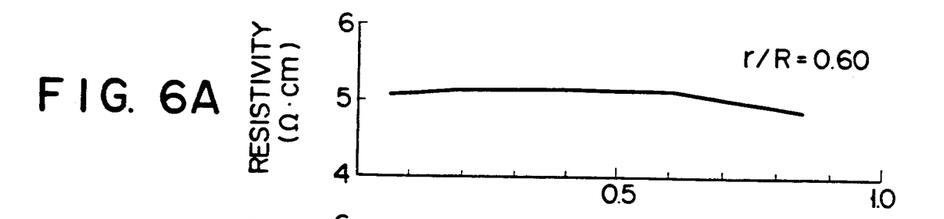
FIGS. 6A to 6F are graphs each showing the relation between the solidification ratio and the impurity concentration of silicon single crystal obtained by the crystal pulling method according to one embodiment of this invention, with r/R used as a parameter.
Figure 6B:
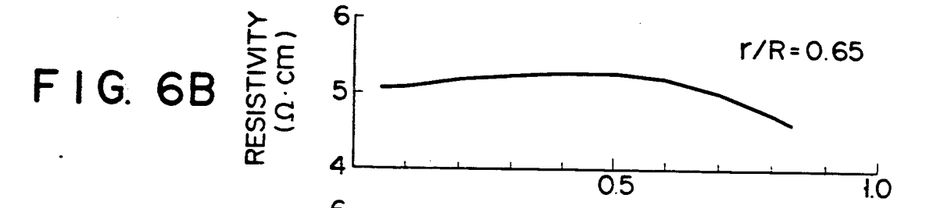
Figure 6C:
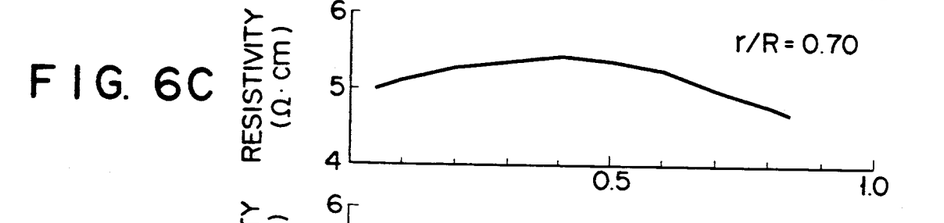
Figure 6D:
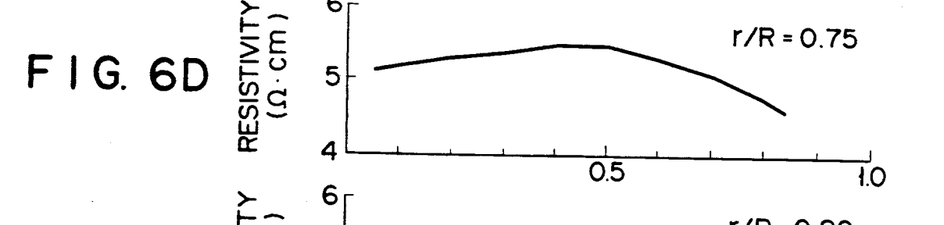
Figure 6E:
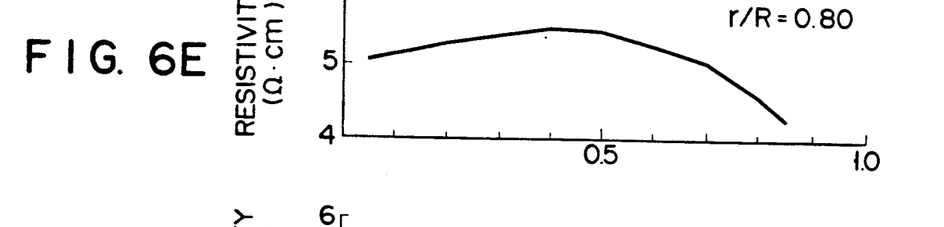
Figure 6F:
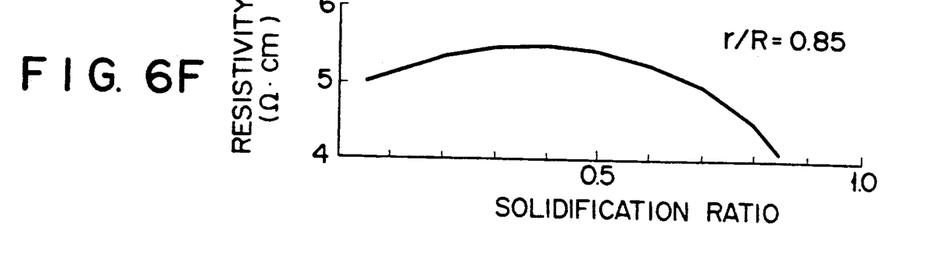

FIG. 5 shows the distribution of impurity concentration of high resistance silicon single crystal having N-type resistivity of 50 Ω.cm and pulled by use of the quartz floating type double crucible. In this case, even if solidification ratio x is set in the range of $0 < x < 1 - (h/H)$, the effective impurity concentration (mark ⊙) or the resistivity cannot be made constant.

Further, it was confirmed that the in-plane distribution of the resistivity of a sliced wafer was obtained in which Δρ was 5 to 20% in the case of plane orientation (or crystal growing orientation) (111) and Δρ was 4 to 10% in the case of plane orientation (100) and these values were the same as those obtained by the CZ technique.

EMBODIMENT 2

In this embodiment, phosphorus (N-type impurity: P, its segregation coefficient is 0.35) was doped into melt in inner chamber 20, boron (P-type impurity: B, its segregation coefficient is 0.80) was doped into melt in outer chamber 21, and N-type silicon single crystal 17 with constant resistivity (5 Ω.cm) in the longitudinal direction was pulled while ratio r/R was variously changed. Now, one example of a crystal pulling method in which a double crucible with ratio r/R set to 0.75 was used, is explained in detail.

First, items relating to solidification ratio x was determined as shown in table 1 in order to solve equation (6).

TABLE 1

| x | 1−x | $(1-x)^{k_{\text{eff}}-1}$ | $|(1-x)^{k_{\text{eff}}-1} - 1|$ |
|---|---|---|---|
| 0 | 1 | 1 | 0 |
| 0.1 | 0.9 | 1.041 | 0.044 |
| 0.2 | 0.8 | 1.088 | 0.090 |
| 0.3 | 0.7 | 1.144 | 0.140 |
| 0.4 | 0.6 | 1.213 | 0.194 |
| 0.5 | 0.5 | 1.300 | 0.254 |
| 0.6 | 0.4 | 1.414 | 0.321 |
| 0.7 | 0.3 | 1.576 | 0.399 |
| 0.8 | 0.2 | 1.837 | 0.493 |

The boron concentration at the initial pulling stage (solidification ratio is 0) is adjusted based on equation (6) so that excess P (phosphorus) can be compensated for by intentionally introduced B (boron) portion in which the solidification ratio is 0.7 and the effective concentration of phosphorus can be set to be equal to that at the initial pulling stage. That is, $C_m^B(0)$ is determined to satisfy the following equation.

$$C_m^B(0) = \frac{0.576}{0.399} \times \frac{(k_{\text{eff}}^B - 1)k_A}{(k_{\text{eff}}^B - k_B)} \times C_m^A(0) \quad (11)$$

where $k_A$ is the segregation coefficient (0.35) of phosphorus, $k_{\text{eff}}^A$ is $0.35/(0.75)^2$, $k_B$ is the segregation coefficient (0.80) of boron, and $k_{\text{eff}}^B = 0.80/(0.75)^2$.

$C_m^B(0)$ was determined based on equation (11), and the expected resistivity and effective phosphorus concentration in the longitudinal direction of crystal of 5 Ω.cm were obtained by calculation as shown in table 2.

TABLE 2

| x | Ceff(x)/C(0) | ρ (Ω · cm) |
|---|---|---|
| 0 | 1 | 5 |

TABLE 2-continued

| x | Ceff(x)/C(0) | ρ (Ω·cm) |
|---|---|---|
| 0.1 | 0.977 | 5.12 |
| 0.2 | 0.958 | 5.21 |
| 0.3 | 0.942 | 5.31 |
| 0.4 | 0.933 | 5.36 |
| 0.5 | 0.933 | 5.36 |
| 0.6 | 0.951 | 5.25 |
| 0.7 | 1 | 5 |
| 0.8 | 1.125 | 4.44 |

As seen from table 2, the resistivity can be sufficiently expected to be made constant.

FIGS. 6A to 6F show the results of the verification experiments effected in conditions that ratios r/R were respectively set at 0.60, 0.65, 0.70, 0.75, 0.80, and 0.85; phosphorus and boron were respectively doped into melts in inner chamber 20 and outer chamber 21, and the effective phosphorus concentration of a portion in which solidification ratio x is 0.70 and that of a portion in which solidification ratio x is 0 were controlled to become equal to each other. From the experiments, it was verified that the resistivity was kept substantially constant at a value of 5 Ω.cm in the longitudinal direction as indicated by the above theory.

As shown in FIGS. 6A to 6F, when ratio r/R is set to any value within the range between 0.60 (or 0.59) and 0.85, the resistivity in the longitudinal direction of crystal can be made constant. Therefore, ratio r/R can be set to a proper value which is preferable to a characteristic other than the resistivity. For example, oxygen concentration [Oi] in silicon single crystal becomes high as the diameter of the crucible with respect to that of the crystal becomes smaller.

Figure 7:
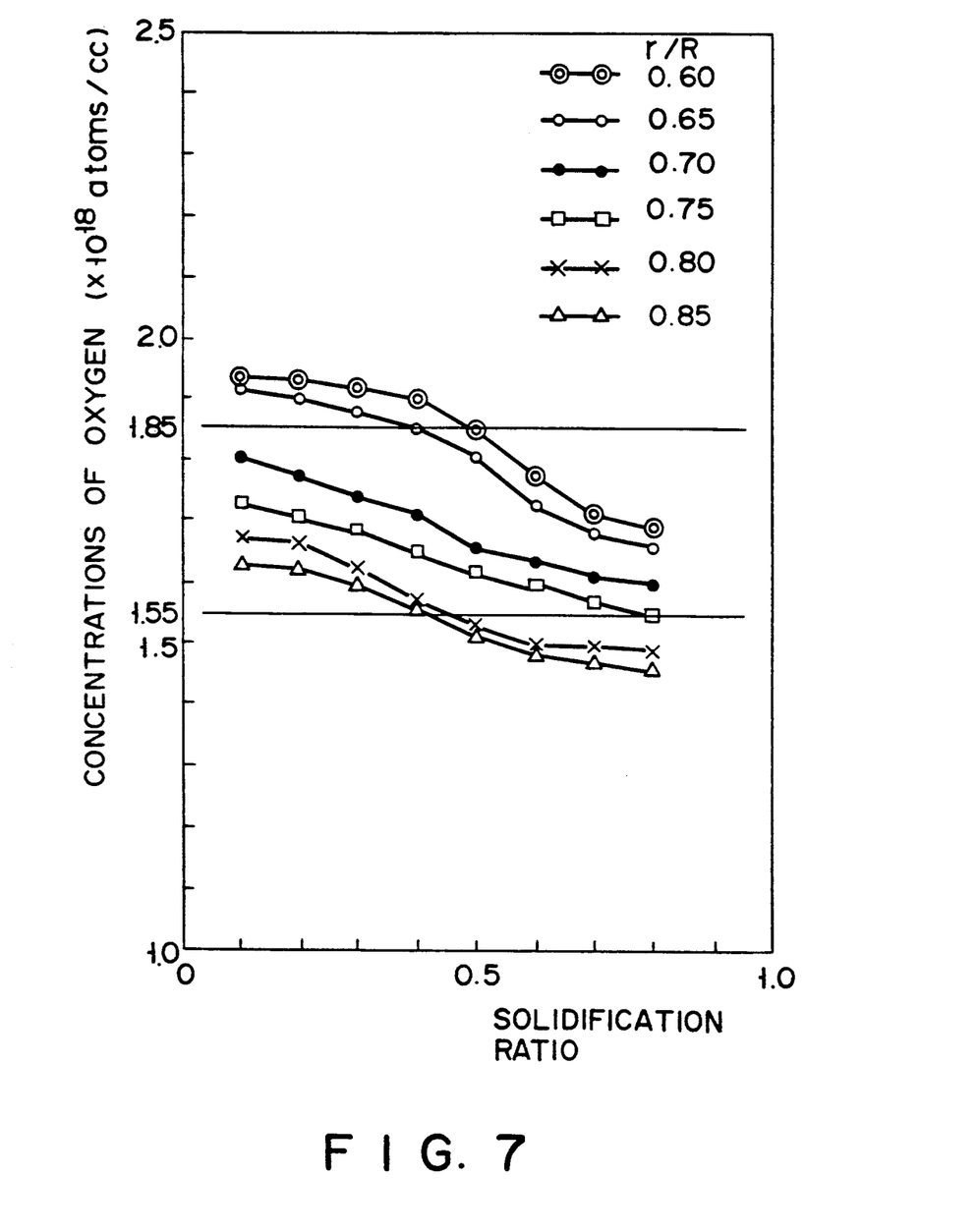
FIG. 7 is a graph showing the relation between the solidification ratio and the oxygen concentration of silicon single crystal obtained by the crystal pulling method according to one embodiment of this invention, with r/R used as a parameter.

FIG. 7 shows oxygen concentration [Oi] in the longitudinal direction of crystals obtained in the above verification experiments. As is clearly seen from FIG. 7, if the specific range of 1.55 to $1.85 \times 10^{18}$ atoms/cc is set with respect to [Oi], the specific [Oi] values can be satisfied by setting ratio r/R to 0.70 or 0.75.

EMBODIMENT 3

In this embodiment, ratio r/R is set to 0.70. boron is doped into the melts in the inner and outer chambers, and single crystal with the resistivity of 10 Ω.cm and oxygen concentration of 1.55 to $1.85 \times 10^{18}$ atoms/cc is grown. For this purpose, equation (9) is solved as follows.

$$kCi(0) = -Co(0)(k_{eff} - k)/(1 - k_{eff}) \quad (12)$$

where k is the segregation coefficient of boron and is 0.80, and $k_{eff}$ can be expressed as follows:

$$k_{eff} = k \times (\pi R^2/\pi r^2) = 1.63 \quad (13)$$

Further, Ci(0) is the concentration of boron in the melt in the inner chamber at the initial pulling stage, and Co(0) is the concentration of boron in the melt in the outer chamber at the initial pulling stage.

Crystal was pulled in a condition that boron was doped into the melt in inner chamber 20 at the concentration of Ci(0) to attain the resistivity of 10 Ω.cm and boron was doped into the melt in outer chamber 21 at a concentration of Co(0) to satisfy equation (12). Then, the single crystal in which the resistivity was constant as shown in FIG. 8 and the oxygen concentration was set within the same specified range as that shown by marks ● in FIG. 7 was obtained.

Figure 8:
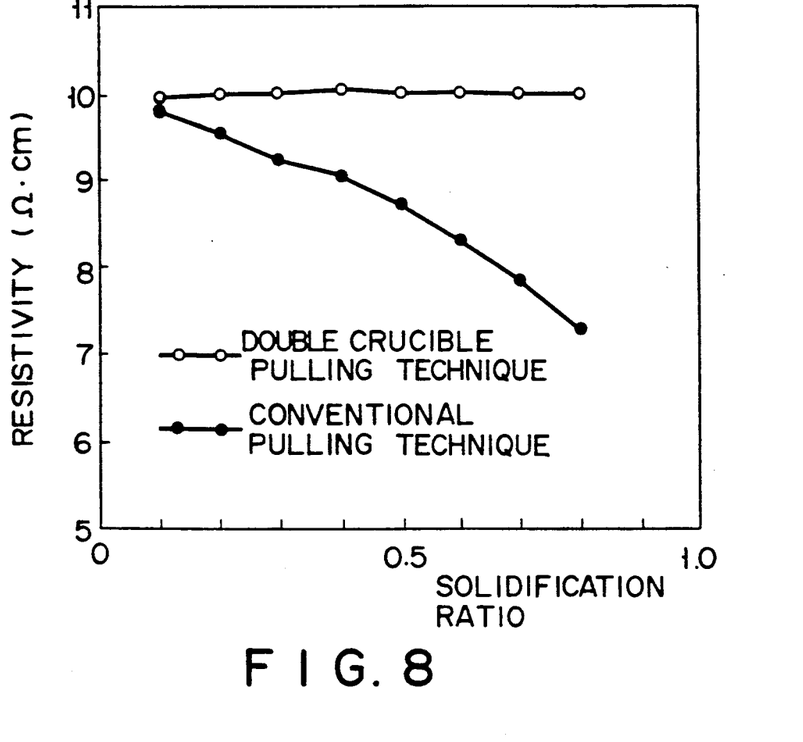
FIG. 8 is a graph showing the relation between the solidification ratio and the impurity concentration of silicon single crystal obtained by the crystal pulling method according to one embodiment of this invention, and the relation between the solidification ratio and the impurity concentration of silicon single crystal obtained by a crystal pulling method other than the crystal pulling method of this invention.

For purposes of comparison, the resistivity of the single crystal obtained by the CZ technique is shown in FIG. 8. As is seen from FIG. 8, the segregation coefficient of boron is 0.80 and is close to 1, and is a dopant which causes the lest variation in the resistivity in the longitudinal direction of crystal. However, when boron is used in the CZ technique, the resistivity will significantly vary from 10 Ω.cm to 7 Ω.cm. In contrast, in this invention, the resistivity can be kept substantially constant, and moreover the oxygen concentration can be set to a desired value.

According to the novel method of this invention, an integral type double crucible different from that used in the conventional CZ technique or floating type double crucible method is used, and the resistivity in the longitudinal direction of the semiconductor single crystal can be made constant. As a result, (a) it becomes possible to pull crystal with the constant and high resistivity of 50 Ω.cm or 100 Ω.cm which cannot be attained by the conventional method and (b) it is possible to pull crystal by use of two types of impurities or two kinds of melts which impurity concentration levels are different each other. Further, (c) it is possible to control not only the resistivity but also a characteristic such as the oxygen concentration other than the resistivity. The features (a), (b), and (c) can be realized with substantially 100% of yield, and therefore the industrial value of the method of this invention is significantly large.

Further, according to the present invention, it is possible to grow single crystal having the distribution of the resistivity in the cross sectional direction (perpendicular to the longitudinal direction) of crystal which is different from the distribution of the resistivity of the FZ crystal and is constant as in the distribution of the resistivity of the CZ crystal. Ge or GaAs can be grown instead of Si by this method of invention. Further, crucible 11 and/or separation wall 14 can be formed of Pylotic-Boron Nitride (PBN), $Si_3N_4$, or SiC, or can be formed of quartz coated with PBN, $Si_3N_4$, or SiC.

What is claimed is:

1. A crystal pulling method comprising the steps of:
    coaxially disposing a separation wall in a semiconductor crystal pulling quartz crucible to divide said crucible into an inner chamber and an outer chamber;
    putting a first silicon material melt into said inner chamber and second silicon material melt into said outer chamber;
    doping said first silicon material melt with phosphorus; and
    pulling phosphorus-doped N-type high resistance single crystal silicon from the first silicon material melt in said inner chamber while the second silicon material melt in said outer chamber is being supplied to said inner chamber, via coupling means for connecting said inner chamber and outer chamber with each other and suppressing an outflow of impurity from said inner chamber to said outer chamber;
    wherein the second silicon material melt in said outer chamber is undoped melt; and a condition of $0.80 \geq \sqrt{Si/(Si+So)} \geq 0.65$ is set to increase the concentration of phosphorus in a longitudinal direction of the crystal and compensate for or cancel influence by conductive impurity which has flowed out of the crucible and mixed into the first silicon material melt, thus controlling the resistivity of the pulling crystal in the longitudinal direction thereof, where Si is the area of the upper surface of melt in said inner chamber, and So is the area of the upper surface of melt in said outer chamber, wherein the resistivity in a longitudinal direction of said phosphorus-doped N-type high resistance silicon single crystal is more than 20 $\Omega$.cm.

2. A crystal pulling method according to claim 1, wherein the resistivity in a longitudinal direction of said phosphorus-doped N-type high resistance silicon single crystal is controlled under a condition of $0.75 \geq \sqrt{Si}/(Si+So) \geq 0.70$.

3. A crystal pulling method according to claim 1, wherein the resistivity in a longitudinal direction of pulling crystal is controlled by introducing P-type impurity into the second silicon material melt in said outer chamber to dilute and compensate for the concentration of the phosphorus doped impurity which is included in the first silicon material melt and whose concentration becomes high during the crystal pulling process.

4. A crystal pulling method comprising the steps of:
coaxially disposing a separation wall in a semiconductor crystal pulling crucible to divide said crucible into an inner chamber and an outer chamber;

putting first doped material melt into said inner chamber and second material melt into said outer chamber, said first material melt containing a dopant impurity and a conductive impurity that has flowed out of said crucible, a sum of an amount of said dopant impurity and said conductive impurity defining a total amount of dopant; and pulling crystal from the first material melt in said inner chamber while the second material melt in said outer chamber is being supplied to said inner chamber, via coupling means for connecting said inner chamber and outer chamber with each other and suppressing an outflow of impurity from said inner chamber to said outer chamber;

wherein the second material melt in said outer chamber is updoped melt, and a condition of $\sqrt{Si}/(Si+So) < \sqrt{k}$ is set to lower a concentration of said dopant impurity in a longitudinal direction of the crystal and render said total amount of dopant substantially constant, thus controlling the resistivity of the pulling crystal in the longitudinal direction thereof, where k is the segregation coefficient of said dopant impurity in the first material melt, Si is the area of the upper surface of melt in said inner chamber, and So is the area of the upper surface of melt in said outer chamber.

5. A crystal pulling method according to claim 4, wherein the resistivity in a longitudinal direction of pulling crystal is controlled by introducing impurity, having the same conductivity type as a conductivity type of the dopant impurity, into the second material melt in said outer chamber to adjust the concentration of the dopant impurity which is included in the first material melt and whose concentration becomes low during the crystal pulling process.

6. A crystal pulling method comprising the steps of:
coaxially disposing a separation wall having a tubular figure in a semiconductor crystal pulling quartz crucible to divide said crucible into an inner chamber and an outer chamber;

putting a first silicon material melt into said inner chamber and second silicon material melt into said outer chamber;

doping said first silicon material melt with phosphorous; and pulling phosphorus-doped N-type high resistance single crystal silicon from the first silicon material melt in said inner chamber while the second silicon material melt in said outer chamber is being supplied to said inner chamber, via coupling means for connecting said inner chamber and outer chamber with each other and suppressing an outflow of impurity from said inner chamber to said outer chamber;

wherein the second silicon material melt in said outer chamber is undoped melt; and a condition of $0.80 \geq (r/R) \geq 0.65$ is set to increase a concentration of phosphorus in a longitudinal direction of the crystal and compensate for or cancel influence by conductive impurity which has flowed out of the crucible and mixed into the first silicon material melt, thus controlling the resistivity of the pulling crystal in the longitudinal direction thereof, where r is half the inner diameter of said inner chamber, and R is half the inner diameter of said outer chamber, wherein the resistivity in a longitudinal direction of said phosphorus-doped N-type high resistance silicon single crystal is more than 20 $\Omega$.cm.

7. A crystal pulling method according to claim 6, wherein the resistivity in a longitudinal direction of said phosphorus-doped N-type high resistance silicon single crystal is controlled under a condition of $0.75 \geq (r/R) \geq 0.70$.

8. A crystal pulling method according to claim 6, wherein the resistivity in a longitudinal direction of pulling crystal is controlled by introducing P-type impurity into the second silicon material melt in said outer chamber to dilute and compensate for the concentration of the phosphorus which is included in the first material melt and whose concentration becomes high during the crystal pulling process.

9. A crystal pulling method according to claim 1 or 6, wherein said coupling means comprises a hole, and said step of doping said first silicon material melt is effected such that reverse flow of the first silicon material melt from said inner chamber to said outer chamber is prevented.

10. A crystal pulling method according to claim 1 or 6, wherein said coupling means comprises a hole; and said method further comprising a step of doping said second silicon material melt after a shoulder such that reverse flow of the first silicon material melt from said inner chamber to said outer chamber is prevented.

11. A crystal pulling method comprising the steps of:
coaxially disposing a separation wall having a tubular figure in a semiconductor crystal pulling crucible to divide said crucible into an inner chamber and an outer chamber;

putting first doped material melt into said inner chamber and second material melt into said outer chamber, said first material melt containing a dopant impurity and a conductive impurity that has flowed out of said crucible, a sum of an amount of said dopant impurity and said conductive impurity defining a total amount of dopant; and pulling crystal from the first material melt in said inner chamber while the second material melt in said outer chamber is being supplied to said inner chamber, via coupling means for connecting said inner chamber and outer chamber with each other and suppressing an outflow of impurity from said inner chamber to said outer chamber;

wherein the second material melt in said outer chamber is updoped melt, and a condition of $(r/R) < \sqrt{k}$ is set to lower a concentration of said dopant impurity in a longitudinal direction of the crystal and render said total amount of dopant substantially constant, thus controlling the resistivity of the pulling crystal in the longitudinal direction thereof, where k is the segregation coefficient of said dopant impurity in the first material melt, r is half the inner diameter of said inner chamber, and R is half the inner diameter of said outer chamber.

12. A crystal pulling method according to claim 11, wherein the resistivity in a longitudinal direction of pulling crystal is controlled by introducing impurity, having the same conductivity type as a conductivity type of the dopant impurity, into the second material melt in said outer chamber to adjust the concentration of the dopant impurity which is included in the first material melt and whose concentration becomes low during the crystal pulling process.

13. A crystal pulling method according to claim 1 or 6, wherein said coupling means comprises a pipe-like passage, and said step of doping said first silicon material melt is effected after a surface level of the first material melt is substantially equal to a surface level of the second material melt.

14. A crystal pulling method according to claim 1 or 6, wherein said coupling means comprises a pipe-like passage; and said method further comprising a step of doping said second silicon material melt after a surface level of the first material melt is substantially equal to a surface level of the second material melt.

15. A crystal pulling method comprising the steps of:
coaxially disposing a separation wall in a semiconductor crystal pulling crucible to divide said crucible into an inner chamber and an outer chamber;
putting first material melt into said inner chamber and second material melt into said outer chamber;
doping said first material melt with a dopant impurity; and
pulling crystalline material from the first material melt in said inner chamber while the second material melt in said outer chamber is being supplied to said inner chamber, via coupling means for connecting said inner chamber and outer chamber with each other and suppressing an outflow of said dopant impurity from said inner chamber to said outer chamber;
wherein the second material melt in said outer chamber is updoped melt; and a condition of $0.80 \geq \sqrt{Si/(Si+So)} \geq 0.65$ is set to increase a concentration of said dopant impurity in a longitudinal direction of the crystal being pulled and compensate for or cancel influence by conductive impurity which has flowed out of the crucible and mixed into the first material melt, thus controlling the resistivity of the crystal being pulled in the longitudinal direction thereof, where Si is the area of the upper surface of melt in said inner chamber, and So is the area of the upper surface of melt in said outer chamber.

* * * * *